United States Patent
Haroun

(10) Patent No.: US 9,572,276 B2
(45) Date of Patent: Feb. 14, 2017

(54) SMART MISSION CRITICAL RACK

(71) Applicant: Cinnos Technologies, Inc., Hamilton (CA)

(72) Inventor: Hussam Haroun, Toronto (CA)

(73) Assignee: Cinnos Technologies, Inc. (CA)

( * ) Notice: Subject to any disclaimer, the term of this patent is extended or adjusted under 35 U.S.C. 154(b) by 0 days.

(21) Appl. No.: 14/933,023

(22) Filed: Nov. 5, 2015

(65) Prior Publication Data

US 2016/0135323 A1 May 12, 2016

Related U.S. Application Data

(60) Provisional application No. 62/076,202, filed on Nov. 6, 2014.

(51) Int. Cl.
| | |
|---|---|
| *H05K 5/00* | (2006.01) |
| *A47F 7/00* | (2006.01) |
| *A47B 81/00* | (2006.01) |
| *H05K 7/14* | (2006.01) |
| *G06F 1/18* | (2006.01) |

(52) U.S. Cl.
CPC ............. *H05K 7/1488* (2013.01); *G06F 1/181* (2013.01); *H05K 7/1485* (2013.01)

(58) Field of Classification Search
CPC ...... H05K 7/1485; H05K 7/1488; G06F 1/181
USPC ....... 361/724–727; 211/26; 312/223.1, 223.2
See application file for complete search history.

(56) References Cited

U.S. PATENT DOCUMENTS

| | | | |
|---|---|---|---|
| 6,065,821 A | 5/2000 | Anderson et al. | |
| 6,535,391 B2 | 3/2003 | Larsen et al. | |
| 6,788,542 B2 | 9/2004 | Rumney | |
| 6,836,811 B2 | 12/2004 | Ho et al. | |
| 7,277,273 B2 | 10/2007 | Smith et al. | |
| 7,639,486 B2 | 12/2009 | Champion et al. | |
| 7,804,685 B2 * | 9/2010 | Krietzman | H05K 7/20736 165/104.19 |
| 8,018,724 B2 | 9/2011 | Jian | |
| 8,035,985 B2 | 10/2011 | Nemoz et al. | |
| 8,054,635 B2 | 11/2011 | Olesiewicz et al. | |
| 8,174,824 B2 | 5/2012 | Westphall | |
| 8,437,123 B2 | 5/2013 | Sun | |
| 8,464,878 B2 | 6/2013 | Andersen et al. | |
| 8,556,093 B2 | 10/2013 | Davis et al. | |
| 8,582,299 B1 * | 11/2013 | Phillips | H05K 7/1489 361/724 |
| 8,607,996 B2 * | 12/2013 | Yang | H05K 7/1488 211/162 |

(Continued)

FOREIGN PATENT DOCUMENTS

| | | |
|---|---|---|
| DE | 4130615 A1 | 3/1993 |
| WO | WO03105549 | 12/2003 |

OTHER PUBLICATIONS

"WR Series Roll Out Rotating System in Steel Host Enclosure", technical product note, Middle Atlantic Products, 96-01005/rev4f/ Nov. 30, 2010; 2 pages.

(Continued)

*Primary Examiner* — Nidhi Thaker
(74) *Attorney, Agent, or Firm* — Duane C. Basch; Basch & Nickerson LLP

(57) ABSTRACT

Disclosed is a space and cost-efficient smart rack system designed for use in a data center or as a similar electronic component housing enclosure.

14 Claims, 11 Drawing Sheets

(56) References Cited

U.S. PATENT DOCUMENTS

| | | | |
|---|---|---|---|
| 8,854,822 B2 | 10/2014 | Hazzard et al. | |
| 2004/0132398 A1 | 7/2004 | Sharp et al. | |
| 2005/0259404 A1 | 11/2005 | Marraffa | |
| 2007/0091550 A1* | 4/2007 | Smith | H05K 7/1488 361/679.02 |
| 2008/0080149 A1 | 4/2008 | Hanna et al. | |
| 2009/0071916 A1* | 3/2009 | Becklin | H05K 7/1421 211/26 |
| 2009/0184072 A1 | 7/2009 | Fischer et al. | |
| 2009/0224639 A1* | 9/2009 | Sosin | H04Q 1/10 312/223.1 |
| 2010/0317278 A1 | 12/2010 | Novick | |
| 2011/0149524 A1* | 6/2011 | Westphall | H05K 7/1425 361/725 |
| 2013/0265725 A1* | 10/2013 | Harvilchuck | G06F 1/181 361/720 |
| 2013/0335913 A1 | 12/2013 | Brashers et al. | |
| 2014/0055959 A1 | 2/2014 | Manda | |
| 2015/0002006 A1* | 1/2015 | Segroves | H05K 7/1491 312/236 |

OTHER PUBLICATIONS

PCT/CA2015/051141 An International Search Report and Written Opinion dated Jan. 27, 2016 for PCT/CA2105/051141 filed Nov. 5, 2015; Inventor Hussam Haroun.

"DoD Data Center Project: Beating Schedule and Budget Requirements," www.datacenterjournal.com, 4 pages; Feb. 3, 2012.

Tripp Lite SR42UBKD 42U Rack Enclosure Server Cabinet Knock-Down with Doors and Sides, www.amazon.com, 6 pages; Oct. 2014.

"Data Centre Cabling Considerations: Point-to-Point vs Structured Cabling", Structured Cabling Services Limited, structured-cabling.co.uk, 9 pages; Oct. 2014.

GBlack Box 19; Sliding Pivoting Keyboard Tray with Side Mouse Tray—rack ke www.cdw.com; 3 pages.

* cited by examiner

SMART MISSION CRITICAL RACK

This application claims priority under 35 U.S.C. §119(e) from U.S. Provisional Patent Application No. 62/076,202 for SMART MISSION CRITICAL RACK, by Hussam Haroun, filed Nov. 6, 2014, which is hereby incorporated by reference in its entirety.

Disclosed herein is a smart rack system designed for use in a data center or as a similar cost-effective electronic component housing system that is self-contained so as to avoid the need for significant infrastructure services. The disclosed rack system is not only modular in design, but the disclosed features further enable the efficient use of space and the incremental addition of racks in data centers.

BACKGROUND AND SUMMARY

Traditionally, data centers are built based on a multi-year (e.g., 10 year) forecast which results in about wasted capacity (typ. approx. 48%). To put things into perspective, the way that current data centers are built to cool and power IT equipment can be compared to cooling and powering an entire room just to cool a bottle of water, sitting on a shelf, in the middle of the room. While the data center industry has evolved toward prefabricated modular containerized solutions, thereby reducing the wasted capacity by approx. 20%, over 57% of customers surveyed still found the price tag unattractive, typically reaching up-to 40% more than a traditional built data enters. CINNOS' proprietary Smart Mission Critical Rack (Smart MCR) is an all-in-one prefabricated modular system that reduces oversizing by approx. 30% compared to traditional mission critical facility builds, and with a cost that is approx. 40% less.

Referring to FIG. 1, the difference in region 170, between the Actual Load (110) and the designed capacity (160) represents an often occurring scenario, where the loads are not properly estimated or there is a design limit that is exceeded before the anticipated capacity is achieved (e.g., power). As will be described in detail herein, the ability to make smaller incremental "steps" in installed capacity (120) versus a typical installed capacity (140) reduces the wasted capacity represented by region 130 as the expected capacity (150) may never be achieved. After typically after 2+ years of planning, design, construction & commissioning, equipment is installed in a mission critical facility (MCF). Unfortunately that is a very lengthy timeline. And, research shows that over a 10-year period, about 50% of customers surveyed, indicate that 48% of their facilities are underutilized (e.g., running out of power, but not space). In the disclosed solution the payback period is shortened and wasted capacity is reduced by allowing rapid procurement of an all-In-1 rack system that is just plug-n-play. To solve the problem, it was necessary to shorten the deployment schedule, eliminate the wasted capacity, and make the rack system affordable. Using a novel all-in-1 smart mission critical rack (MCR) design the requirements are met. Through the unique system design disclosed herein, including smart controls and integrated fire protection, the improved rack structure enables system users to:

- Maximize real estate usage by deploying back to back and side by side rack installation configurations,
- Improve energy efficiency by monitoring and controlling the environment within the smallest possible footprint, and
- Grow using a low-cost, pay-as-you-grow model And from the time the business need is generated, a two month deployment schedule is possible, and it is also possible to deploy a single rack at a time at a lower cost due to the modular nature of the rack design. In the scenario of FIG. 1 it is possible to achieve up to 4.5 times more power and up to 21% more racks space in the same footprint, while anticipating energy savings and reducing GHG Emissions. In other words, the value proposition allows customers to eliminate their wasted capacity, deploy their IT equipment 70% faster than currently possible, and to do so with a 24% cost reduction.

Disclosed in embodiments herein is a smart mission critical rack system for a data center, comprising: a prefabricated cabinet, said cabinet including front-mounted ports for the connection of data transmission lines, power lines and a coolant source adjacent the top thereof, said cabinet further including a movable rack substructure therein, said substructure being movable relative to the cabinet and pivotable about one side or the other in both clockwise and counter-clockwise directions, and slidable in parallel with the front of the cabinet, when moved out of the cabinet, to permit concurrent access, via only a front-opening door, to the back of all components mounted thereon, said cabinet also has sealed sides and rear surfaces such that no access to the cabinet is provided on the sides or rear and that other cabinets and structures may be installed against both the sides and rear of the cabinet in order to achieve a high system density within a data center; a power supply subsystem, including at least one battery, suitable for receiving AC power and providing DC power to both electrical components within rack system and to charge the a battery (if present); a fire suppression system suitable for suppressing fire within the cabinet; an optional cooling system, said system receiving a source of coolant and maintaining temperatures within the rack system at or below a predetermined temperature for protection and efficient operation of the electrical components; and a controller, operatively connected to the power subsystem, the cooling system, and a plurality of sensors within said cabinet, wherein said controller operatively monitors and controls the delivery of power to and cooling of the electrical components within the cabinet. Accordingly, the rack has three degrees of freedom including horizontal (coming out), moving sideways and rotating for back access.

Further disclosed in embodiments herein is a mission critical rack system for a data center, comprising: a prefabricated cabinet, including at least one front-opening door, sealed side, top and rear surfaces such that, with said at least one front-opening door in a closed position the cabinet is self-contained, and no access to the cabinet is provided on the sides or rear and that other cabinets and structures may be installed against both the sides and rear of the cabinet in order to achieve a high system density within a data center, said cabinet further including a movable rack substructure therein and a sliding plate in a top section of said cabinet, said plate sliding outward on at least one slide when the at least one front-opening door is in an open position; said sliding plate providing support to at least one data cable resting thereon, and said plat further providing an operatively-linked guide for the movable rack substructure, wherein the rack substructure is movable relative to the cabinet.

Figure 1:
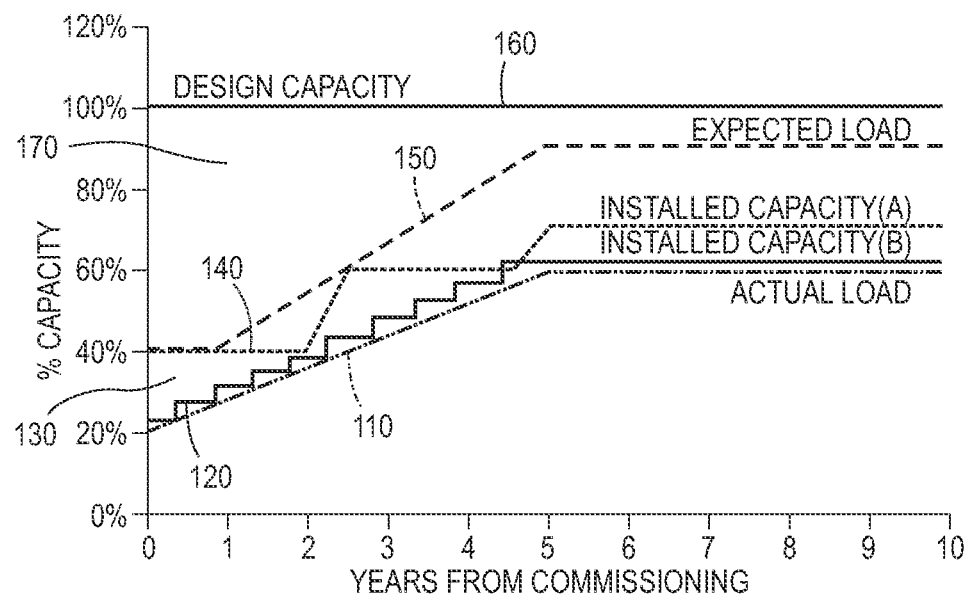
FIG. 1 is an illustrative chart depicting different capacity scenarios in a modular data center.

The various embodiments described herein are not intended to limit the disclosure to those embodiments described. On the contrary, the intent is to cover all alternatives, modifications, and equivalents as may be included within the spirit and scope of the various embodiments and equivalents set forth. For a general understanding, reference is made to the drawings. In the drawings, like references have been used throughout to designate identical or similar elements. It is also noted that the drawings may not have been drawn to scale and that certain regions may have been purposely drawn disproportionately so that the features and aspects could be properly depicted.

DETAILED DESCRIPTION

The disclosed Smart MCR system introduces innovations that achieve higher efficiencies, while reducing emissions in the mission critical facility (MCF) sector. As used herein MCF is a specialized building or facility that houses equipment that is mission critical to a business. Businesses deem as "mission critical" those activities, devices, services, or systems whose failure or disruption will cause a failure in business operations. These facilities are typically built with specialized systems such as backup generators, uninterruptible power supplies, fire suppression systems, precision cooling, environmental and performance monitoring, building management systems, and racking infrastructure. Data centers would fall within this category.

Within MCFs, there are different types of facilities that house businesses' mission critical devices or services. These include traditional (Brick and Mortar) model and the modular design. The traditional model is a building that is built solely to operate as an MCF. The work that goes into this kind of MCF is very labor intensive and involves custom engineering, significant site work, time, and is dependent on the construction industry, which tends to involve very complex processes for such projects, and is also seasonal. Depending on the season, it takes approximately 18 to 24 months, or longer, to complete the construction of a traditional data center due to permitting and typical construction timelines. When built, this type of MCF has 40%-80% wasted capacity due to oversizing based upon a 10 year lifetime projection, and an average overall cost of $123,000 per rack.

A modular MCF is typically standardized and pre-assembled with approximately twenty racks that are integrated in a shipping container offsite, and then shipped to a site to be deployed in a modular fashion. This enables data centers to defer their operational expenses by as much as 50% because their operational costs are now based on only twenty racks. In terms of deployment time, the deployment time of the modular solution is often only 8 to 14 weeks—a much quicker process than the traditional model. This also reduces the need to predict requirements over a 20- to 30-year life span. Why then is the modular adoption rate so low?

1. Even with this model, data centers waste 20% capacity due to oversizing over a 10 year lifetime. The lowest number of racks that data centers can grow by is 20 racks from day 1, even though 80% of business data centers grow by about 1 rack per year.
2. The cost per rack in the modular model is only 14% cheaper than the traditional model—the rack in the modular world costs approximately $106,000 per rack. When asked customers believed that 14% lower costs are not worth completely changing the way they deploy MCFs. Adopting the prefabricated, containerized model given data centers' current infrastructure would be extremely difficult given that they would have to fit a container into an existing building.
3. In addition to price and physical adaptability being factors for low adoption, vendor lock-in and product quality are also factors resulting in low interest in adopting the prefabricated model.

The all-in-one Smart Mission Critical Rack (MCR) disclosed herein is designed to fill the "gaps" in the current MCF space—both traditional and modular, and to address the problems and concerns of adopting the prefabricated modular model. Current prefabricated modular MCF design focuses on providing a multi-rack (high capacity) solution. More specifically, a fully integrated MCF is provided, while achieving the same functions required in a fully functional MCF. Businesses can then grow by the smallest possible scale—growth on a per rack basis. The MCR 1-Rack solution fits in existing gaps—whether a traditional MCF is looking to expand or a customer needs a one-rack solution on the 20th floor of an office building. The Smart MCR is a prefabricated, modular MCF that reduces oversizing compared to traditional MCF builds and is cheaper.

Figure 2:
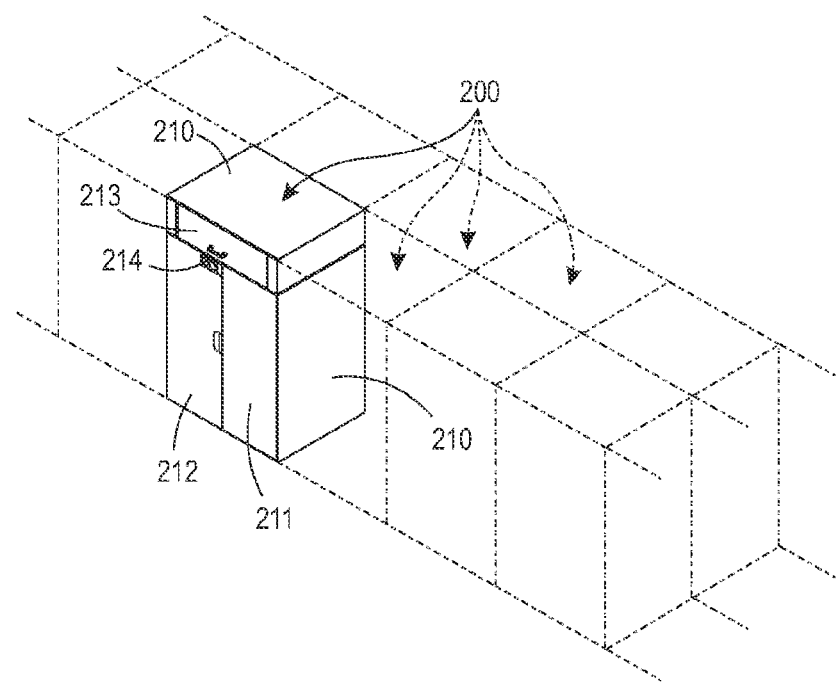
FIGS. 2 and 3 are perspective views of an embodiment of the smart mission critical rack system with the front doors closed and open, respectively.

Having generally characterized several advantages of a self-contained, modular rack system, reference is directed to FIG. 2, where the Smart Mission Critical Rack deployment architecture is depicted. As illustrated, the single-rack Smart MCR 200 has a small increment of growth, and thereby presents a pay-as-your-grow model. Moreover, the design of the rack systems enables back-to-back and side-by-side installations of additional racks 200 in order to optimize the use of floor space within a facility. The systems further include disaster protection (self-contained power treatment and battery backup), along with fire suppression and fire containment within a single enclosure. By virtue of modularity, disaster is limited to a single rack enclosure 200, not the entire data center. Also included in each Smart MCR 200 is a smart controller and associated sensors connected thereto (wired or wireless), whereby the controller is able to monitor the environmental characteristics within the rack system, and to thereby control the operation of the dedicated components (AC, power, etc.) in an efficient manner. Sensors may include temperature sensors ($S_T$), smoke sensors ($S_S$), fire sensors ($S_F$), voltage Sensors ($S_V$), etc. The smart controller (with associated sensors) may be an independent product as well as integrated within the Smart MCR system, and will provide data center infrastructure management (DCIM) with monitoring, reporting, and energy management features in existing and new mission critical facilities.

Referring to FIG. 2-11, illustrated therein is a smart mission critical rack system 200 for a data center.

The illustrated rack system includes a pre-fabricated cabinet having cover plates or surfaces such as sides 210; front access doors 211, 212, and a top access door 213, all of which serve to provide a complete enclosure of the rack system, top to bottom. The illustrated cabinet also includes front-mounted ports 214 for input/output of rack data cables and other resources (power, coolant supply, etc.) via an opening for routing cables out of the rack or a quick disconnect plate (multiple sockets). Such a port or disconnect plate will allow switching racks without the need of rerouting cables for the connection of data transmission lines, power lines and a coolant source adjacent the top thereof. Although illustrated as a front-mounted port or disconnect plate, it is further contemplated that the port(s) 214 may be installed on the top of the cabinet in a similar manner, although such a configuration may require additional overhead clearance for Smart MCR installation.

Figure 3:
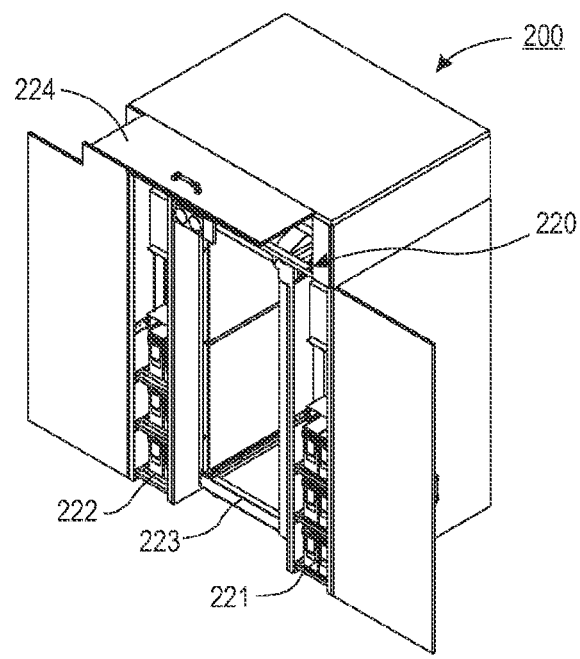
Figure 4:
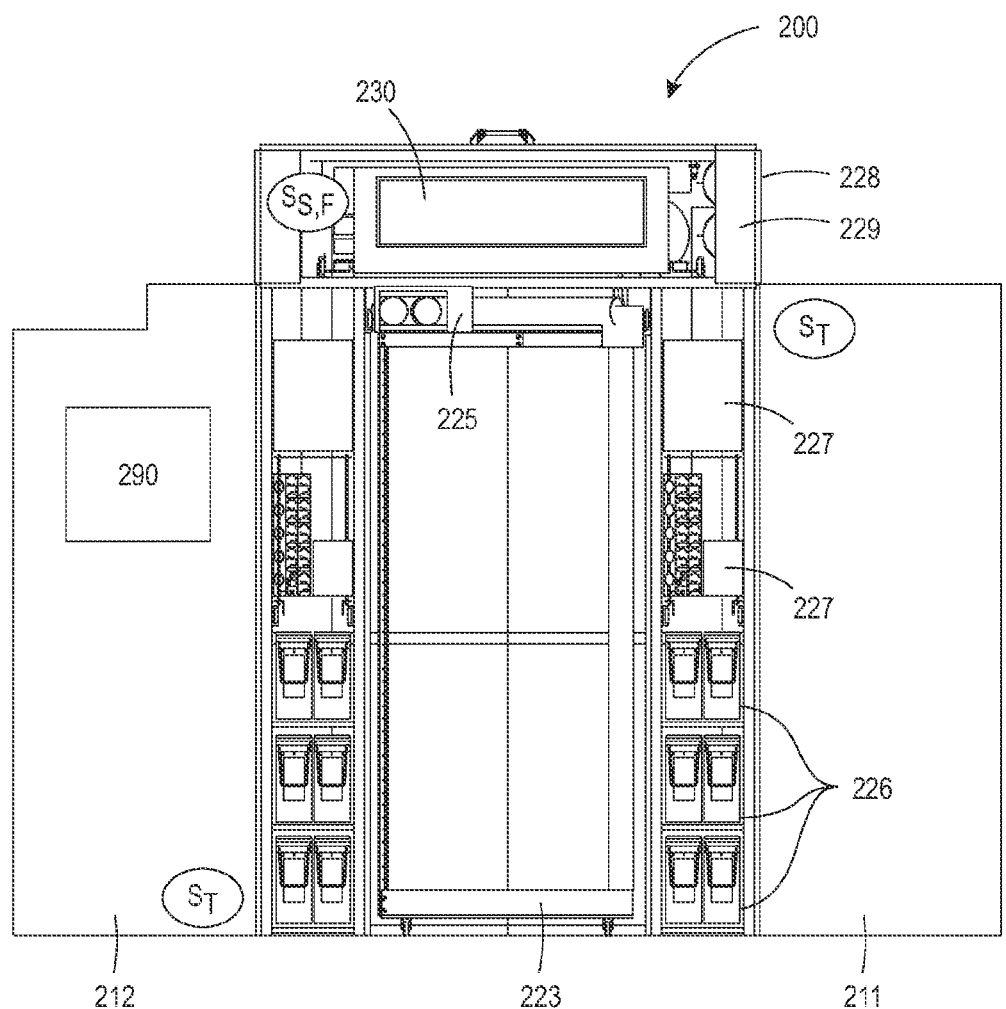
FIG. 4 is a front view of the smart rack system of FIG. 2 in accordance with a disclosed embodiment.
Figure 5:
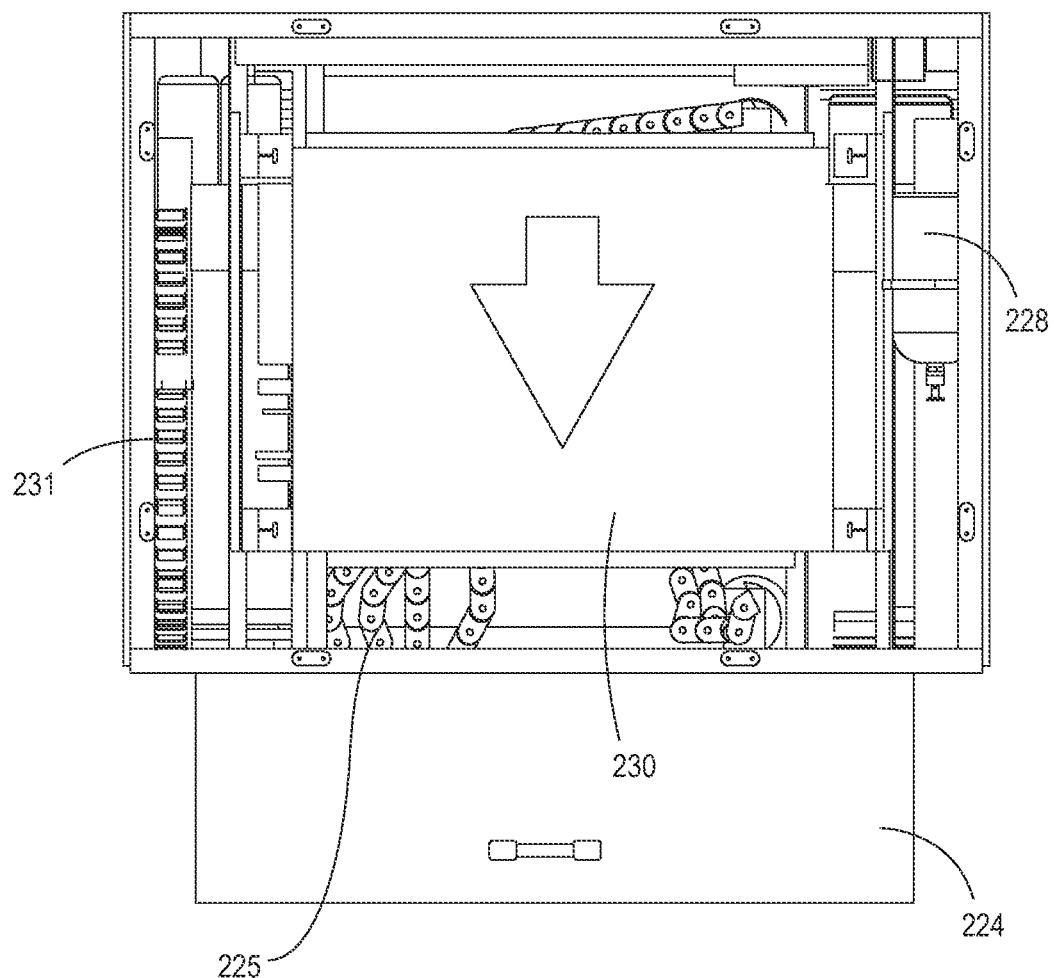
FIG. 5 is a top view of the upper level components in the rack system of FIG. 2 in accordance with a disclosed embodiment.

FIGS. 3-5 illustrate an MCR module 200 in various views with the access doors 211 and 212 on the front of the cabinet opened. The top section 220 comprises a fire suppression system 228 suitable for suppressing fire within the cabinet, a retractable reel of power supply cord for the rack 229, along with either an A/C unit 230 or power equipment 227 (e.g., inverter, DC plant, etc.). In one embodiment, a gas spring cylinder is employed to support the door 224 on the face of top section 220. As illustrated in FIGS. 3-5, right and left sections 221 and 222, respectively, house or contain batteries 226, power equipment 227 and/or A/C unit 230. Moreover, the configuration of these sections may be dependent upon the components assembled therein, and for this reason the configuration is intended for illustrative purposes only and alternative configurations are understood to be possible. As illustrated, for example in FIG. 6, the various components within the top and side sections may be supported and/or mounted within those sections on slides, rollers, or similar structures permitting the components to be easily accessed from the front with the front door(s) 211, 212 of the cabinet opened.

Referring to the detail of the top section or module 220 as illustrated in FIG. 5, the AC unit 230 is mounted so that it slides out to the front when the access door 224 has been opened or removed. In carrier 231, the A/C coolant supply hoses and power cables are maintained on a chain-like carrier, where the movement of the carrier is limited in at least one dimension. The cooling or A/C system 230 receives a source of coolant and maintains temperatures within the rack system at or below a predetermined temperature for protection of the electrical components, and efficient operation of such components. Furthermore, the supply hoses and power cables remain flexible and movable relative to the interior of the cabinet, but are also prevented from becoming entangled with other cabling and equipment within the cabinet. Thus, the cable management system, such as carrier 231, is mounted at one end to a stationary surface of the cabinet and at the other end is connected to the movable A/C unit, so that when the A/C unit 230 slides out the front of the cabinet for servicing or replacement, the hoses do not need to be disconnected beforehand, but can be attached or disconnected when the A/C unit has been extended out the front and access and is available to the hose connections. As illustrated, more than one cable management component (e.g., flexible cable raceway, supporting arm, etc.) may be used to make sure that cables, hoses and other flexible components are able to be pivoted and flexed within a plane, above the movable rack substructure 223, which supports at least power and data cables connected to the rack substructure. As illustrated, the data cabling is maintained within a generally horizontal plane as defined by carrier(s) 240, whereas the coolant and power conductors are in a generally vertical plane defined by carrier 231, thereby avoiding the possibility of unplugging or disconnecting coolant/power/data when the rack or other substructures are moved relative to the cabinet.

Within the central section of the cabinet is the rack substructure 223 with a cable management system 225. The rack is a movable substructure movable relative to the cabinet itself and is also pivotable about one side or the other in both clock-wise and counter-clockwise directions, as well as being slidable in parallel with the front of the cabinet when the rack substructure has been moved out of the cabinet. In one embodiment the rack substructure 223 is a cuboid or rectangular parallelepiped shape designed to fit within the surrounding structure of MCR 200 and components, although other substructure shapes may be employed. Such a configuration is advantageous to permit concurrent access, via only a front-opening door, to the back panels of all components mounted in the rack substructure. The movable rack substructure, and associated side cabinet sections also provide hot/cold aisles for ductless circulation of air by the cooling system. In one embodiment the MCR cabinet 200 has sealed sides and rear surfaces and no access to the cabinet is provided on the sides or rear so that other cabinets and structures may be installed against both the cabinet sides and rear (e.g., FIG. 2) in order to achieve a high system density within a data center. In such a system, the cabinet is a self-contained environment and the A/C system circulates air about the cabinet through the open aisles (e.g., vertical areas in the front and rear of the rack substructure).

Figure 6:
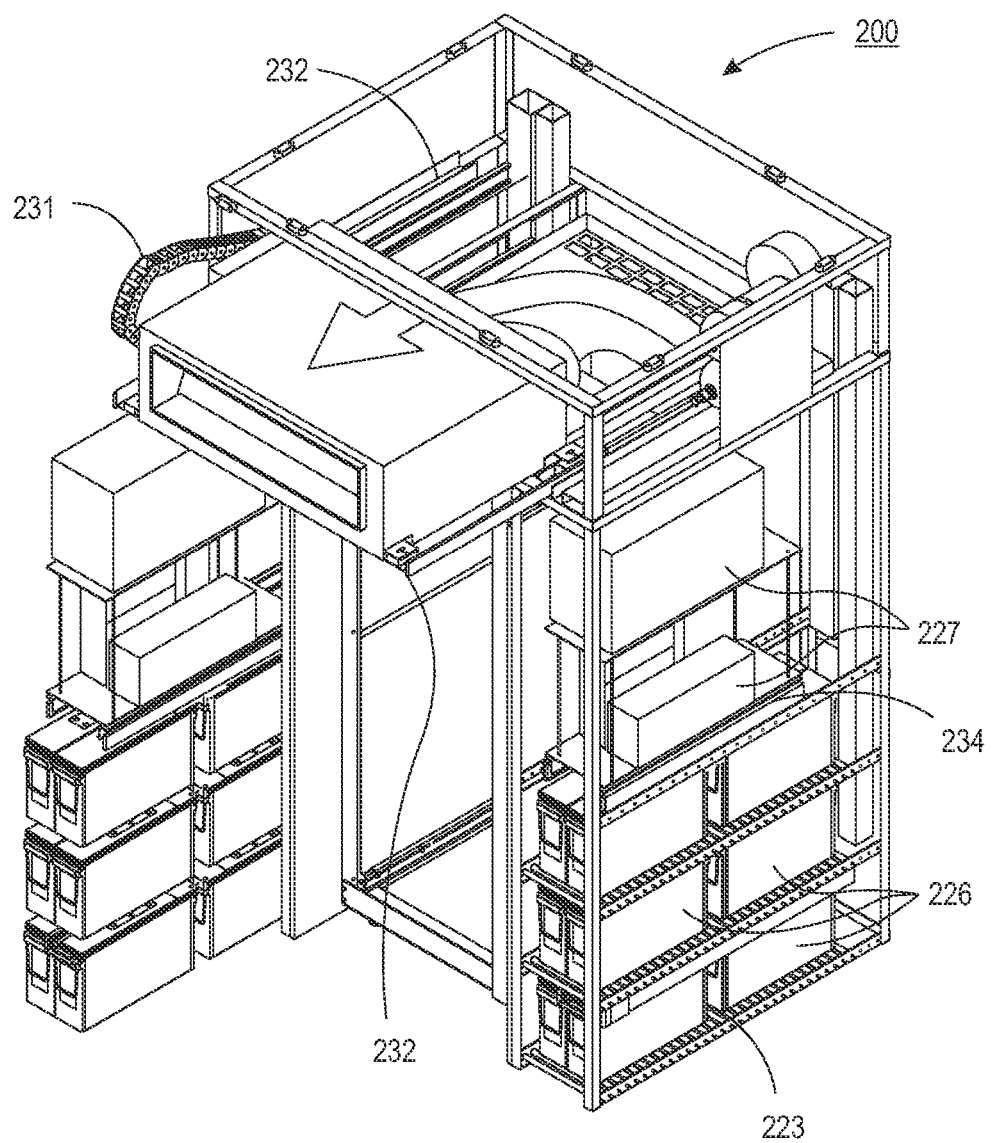
FIG. 6 is a perspective view of the interior components in the rack system of FIG. 2 in accordance with a disclosed embodiment.
Figure 7:
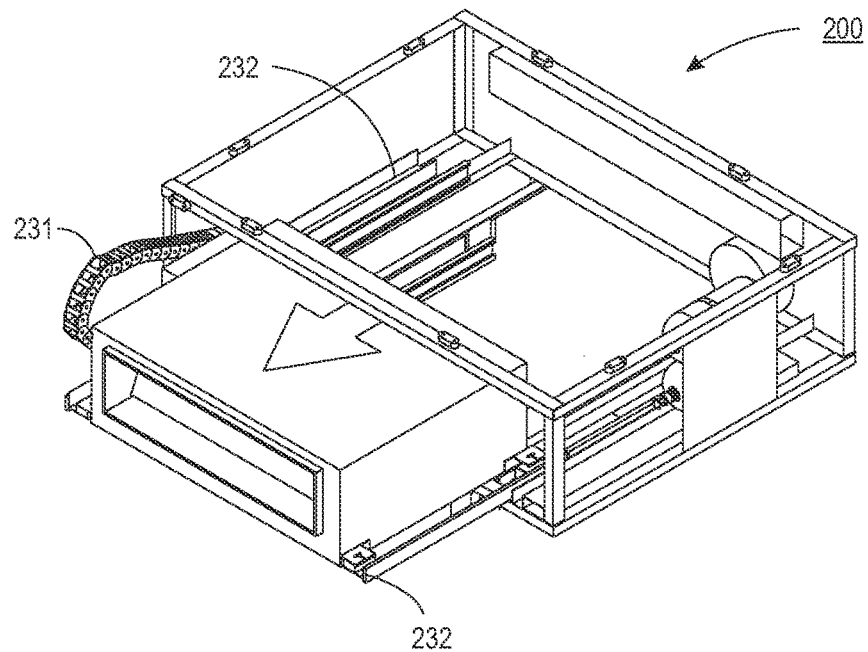
FIG. 7 is an enlarged perspective view of the upper components in the rack system of FIG. 2 in an opened configuration.

FIGS. 6 and 7 show the operation of several components. In FIG. 6, the battery racks are illustrated. The racks include shelves 234 that may either be installed on slides and/or include rollers as the supporting surface for the battery in order to facilitate installation and removal of the heavy battery containers 226. And, as noted above, the top of the cabinet includes the A/C unit as depicted in FIG. 7, where A/C hoses and power conductors are retained within carrier 231 to prevent the hoses from breaking or becoming disconnected while pulling A/C unit out. In one embodiment, slide rails 232 facilitate access to the A/C or power equipment mounted thereon. In combination with the batteries, power conditioning unit 227 provides a power supply subsystem, suitable for receiving AC power as an "input" to the cabinet and providing DC power to both electrical components within the rack system as well as to charge the batteries. It will also be appreciated that the batteries may be employed to at least temporarily deliver power to the A/C unit, and an optional outside condenser, as well as other equipment in the cabinet in the event of a failure or interruption of outside power provided to the Smart MCR.

Also included within the cabinet (e.g., door-mounted or installed within another section of the cabinet), is a controller 290, operatively connected to the power subsystem, the cooling system, with a plurality of sensors within cabinet, where the controller operatively monitors and controls the delivery of power to, and cooling of, the electrical components within the cabinet.

Figure 8:
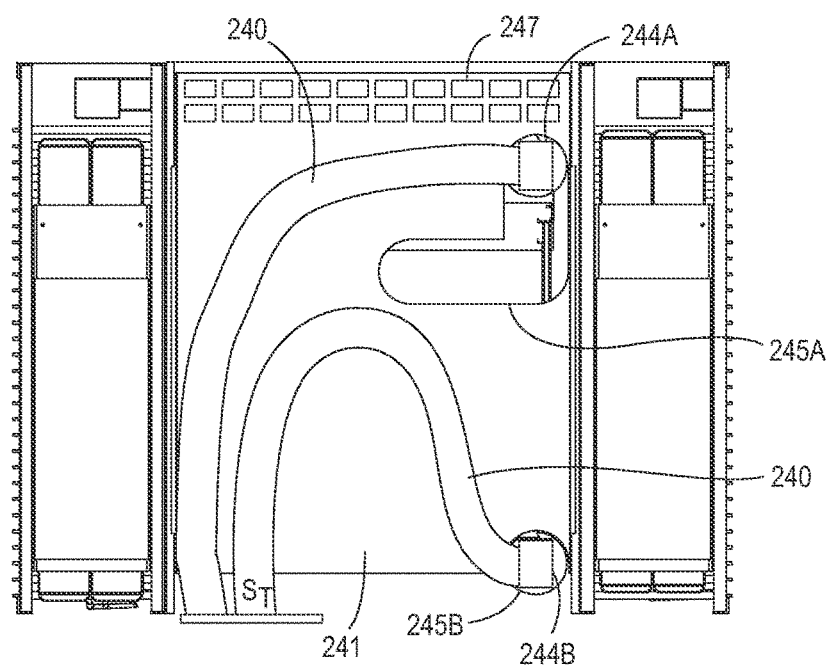
FIG. 8 is a top view of the movable rack substructure in the rack system of FIG. 2 in accordance with a disclosed embodiment.
Figure 9:
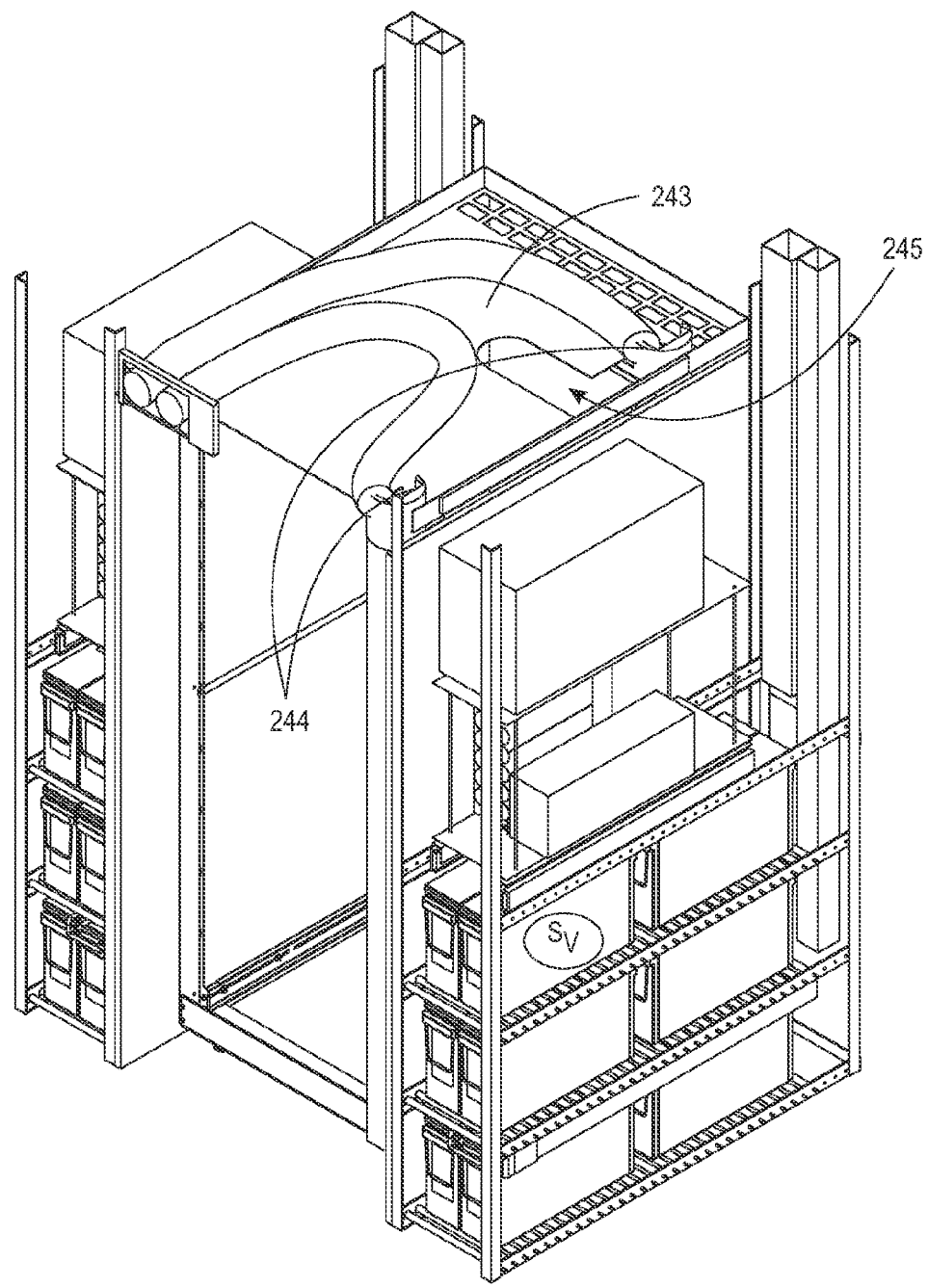
FIGS. 9-11 are alternative views of the movable rack substructure.
Figure 10:
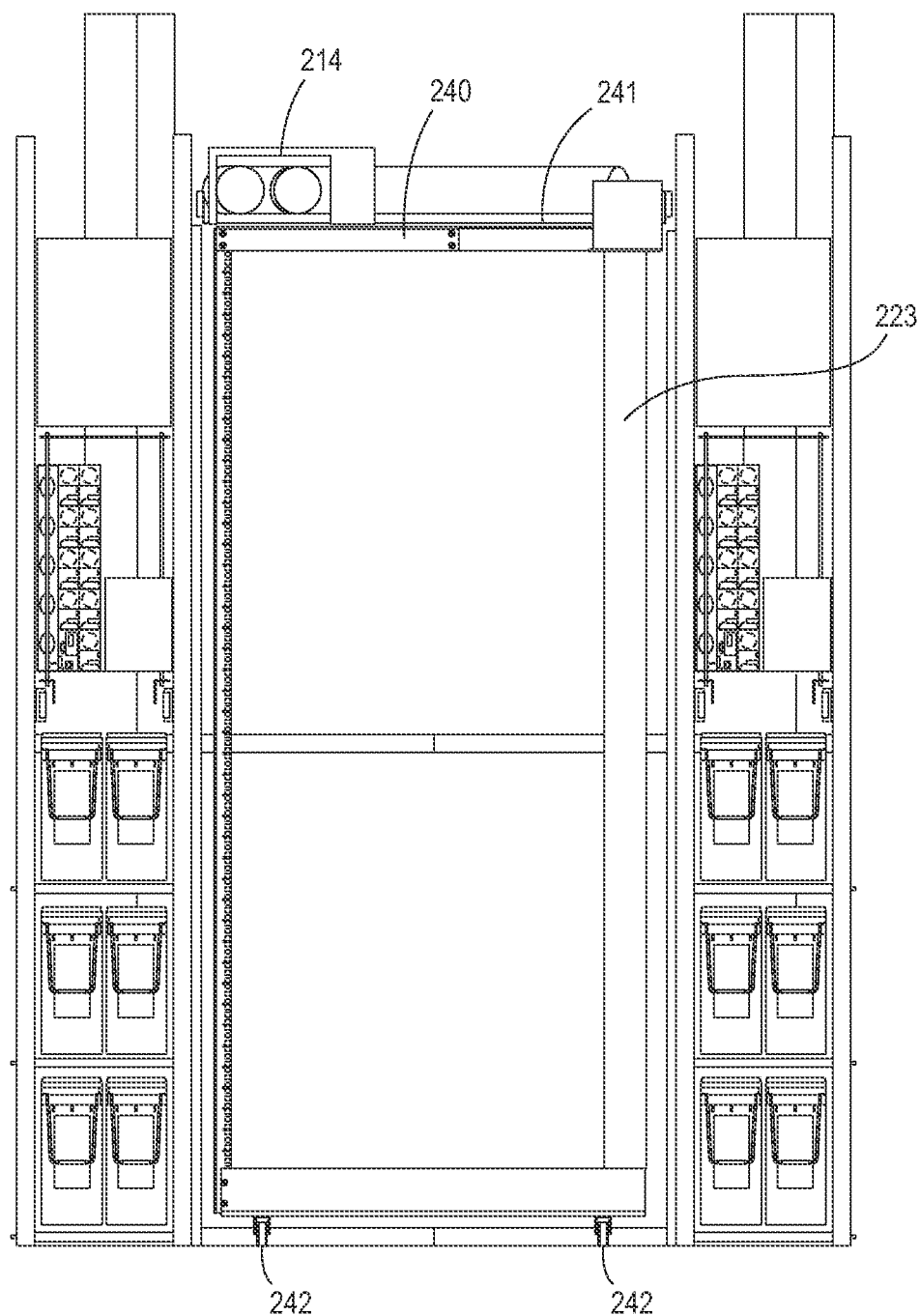

FIG. 8 illustrates the rack cable management system (top module not shown), where the rack substructure 223 is retained on casters 242 near each corner for mobility as will be described and illustrated below. It will be appreciated that the casters 242 are designed to remain movable with a fully-configured rack substructure 223. Moreover, in one embodiment one or more of the casters (e.g., rear casters) may be straight casters allowing rolling in a generally front-back direction while others may be swivel casters allowing for rolling movement in all directions. However, to provide the maximum flexibility in positioning the rack substructure 223, all casters would be of the swivel type. In yet an alternative embodiment, the casters may be replaced with a combination of slides and releasable pivots, whereby the rack substructure may first be extended from the cabinet on slides and then subsequently moved into a set of perpendicular slides for movement parallel to the front of the cabinet, or the connection to the slides is released for all but one rear corner so the rack substructure may be pivoted about that rear corner to allow access to the rear. The rack has three degrees of freedom: horizontal (coming out), moving sideways and rotating for back access.

Figure 11:
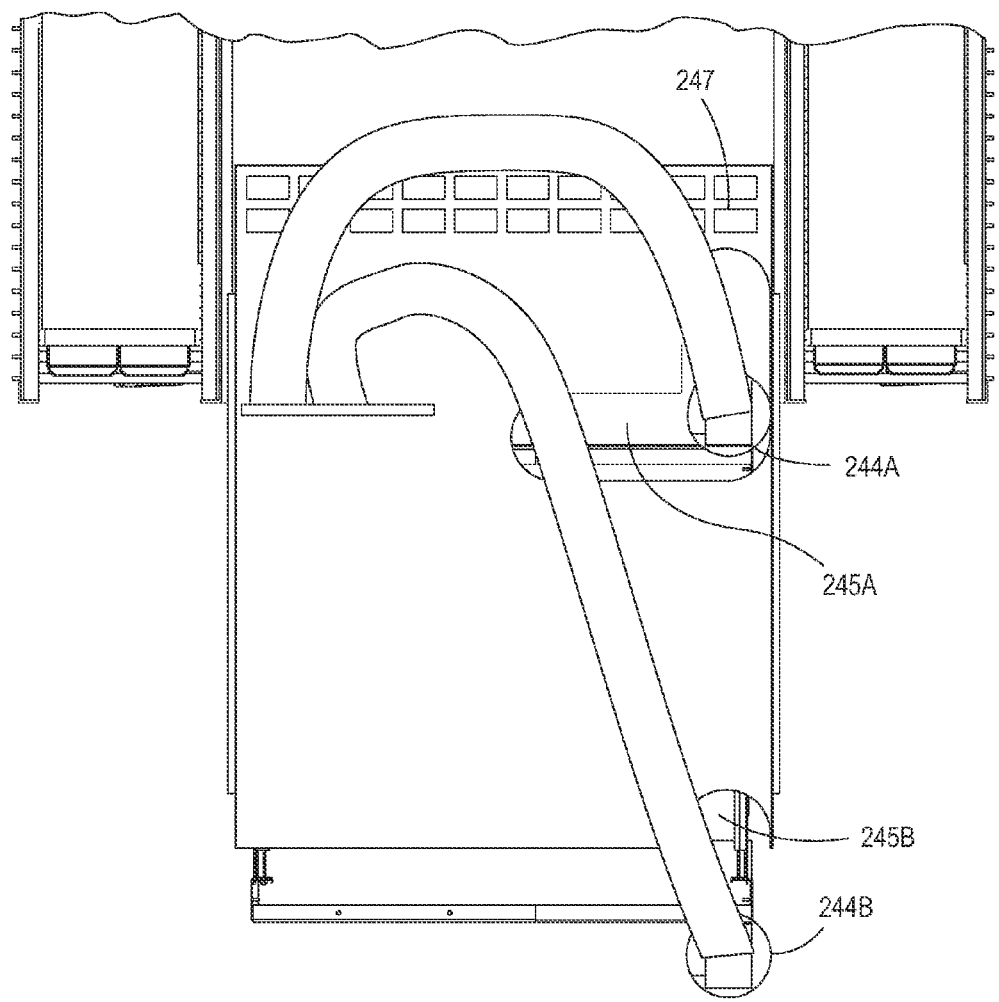

Referring also to FIGS. 6 and 8-10, illustrated therein is I/O panel 214, and data cable carriers/raceways/flexible conduit 240 that serves to control the movement of the various cables etc. when the rack substructure 223 is moved relative to the cabinet. Supporting plate 241 is mounted on slide rails and provides support for carriers (240) when the rack substructure is moved or pulled out. The cable tray 243 is attached to rack substructure 223, and cylindrical fittings 244 moves within slots 245 (245A, 245B). As depicted in FIG. 11, the front fitting 244B may be disassociated with the slot when the rack is moved outward from the cabinet to provide access to the rear of the rack, whereas the inner or rear fitting 244A would stay within the L-shaped slot 245A. Supporting plate 241 is also used as a mounting base for the cable carriers 240, where the perforated part 247 of supporting plate is provided for cooling airflow for the top A/C unit along the rear vertical channel (behind the rack). This configuration provides the flexibility in the associated systems and cabling to permit the rack substructure to be moved a substantial distance relative to the cabinet and permit access to the rear of the rack as well as to other components within the cabinet.

Figure 12A:
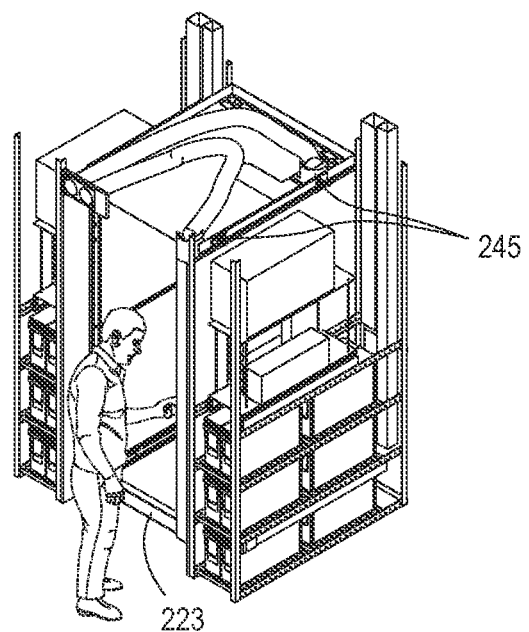
FIGS. 12A-12D are perspective views of the movable rack substructure in different positions to illustrate the access afforded to rack-mounted components in the rack system of FIG. 2 in accordance with a disclosed embodiment.
Figure 12B:
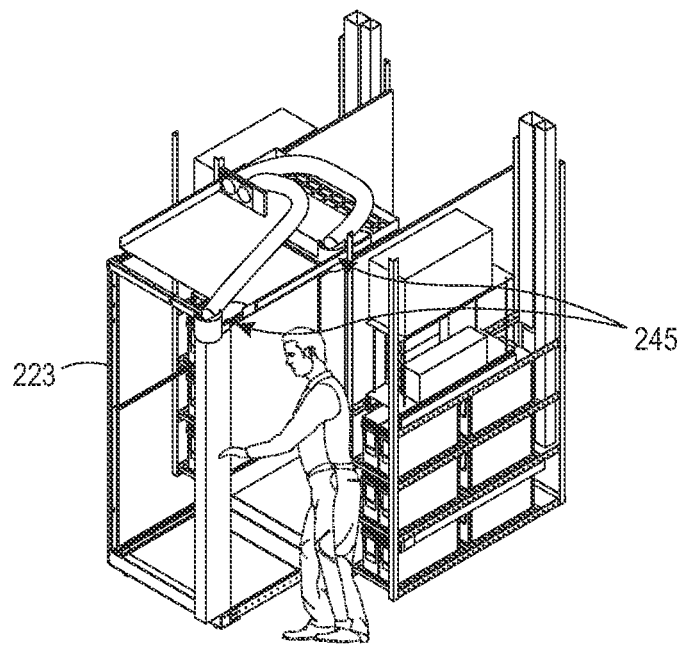

Referring also to FIGS. 12A-12D, the operation of removing the rack substructure from the cabinet in order to obtain access to the rear of the rack substructure 223 will be discussed. When pulling the rack 223 outward fitting 244A moves within slot 245. Once the end of the slot is reached the supporting plate is pushed by fitting 245 and moves with the rack substructure providing support for cable carriers 240. More specifically, FIG. 12A illustrates the rack substructure pulled out until fitting 244A touches end of the slot 245A. In FIG. 12B, as the rack substructure 223 continues to be moved forward, it causes supporting plate movement in the same direction as the rack. And, due to slot 245A fully enclosing fitting 244A which is fixed to the top of the rack substructure, the rack is stopped when the slide rails of supporting plate 241 are fully extended (e.g., FIG. 12B). In summary, the MCR cabinet 200 includes a movable rack substructure beneath a sliding plate in a top section of the cabinet. The plate slides outward through the door opening on a slide(s) while at the same time providing support to at least one data cable resting on or operatively attached to the plate. The combination of the fittings 244 and associated slots 245 further provide an operative-link and guide for the movable rack substructure, wherein the rack substructure is movable relative to the cabinet, but is constrained by the fittings and the shapes/position of slots 245.

Figure 12C:
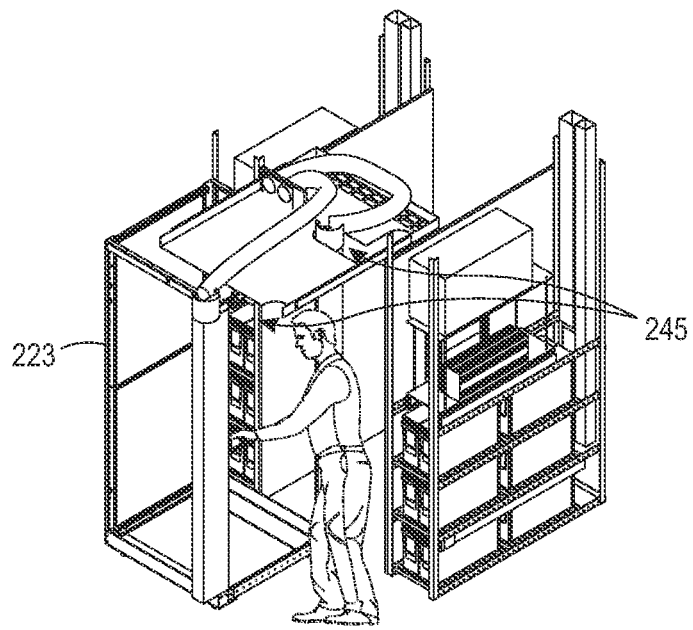
Figure 12D:
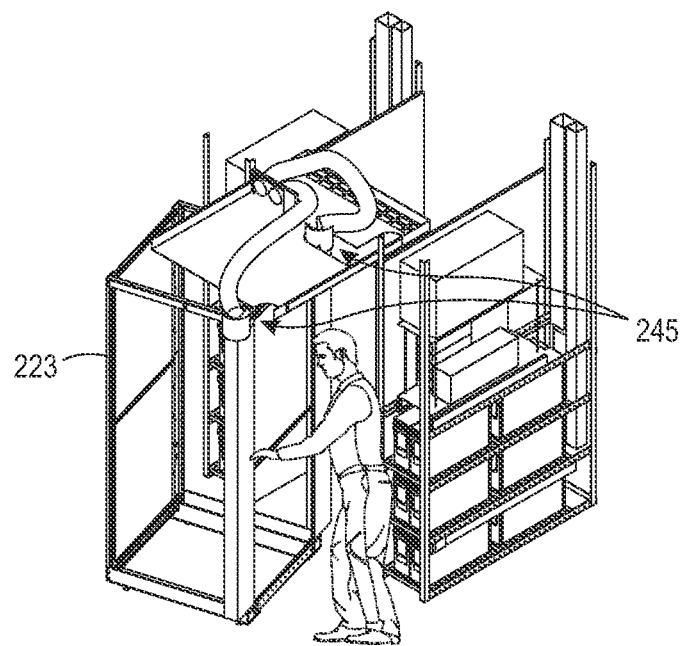

In FIG. 12C the rack substructure is further moved in a perpendicular direction allowing access to the interior of the cabinet and rear of the rack. And, as depicted in FIG. 12D, full rear access to the rack can be obtained. Further contemplated is where an operator might remain inside the cabinet and the rack is returned to position presented in FIG. 12B in order to obtain access to the rear of the rack substructure. It will be further appreciated that narrowing the rack or increasing the cabinet width allows the operator to have full access to the rear of the rack by rotating the rack in the manner depicted in FIG. 12D. As illustrated, the movable rack substructure 223 permits concurrent access, via only a front-opening cabinet door(s), to the back of all components mounted in the rack substructure. Such a cabinet configuration, in combination with front-mounted ports for the connection of data, power and a coolant source and fully-enclosed or sealed sides permits the Smart MCR system 200 to be installed with other cabinets or facility structures against both the sides and rear of the cabinet. Such a configuration achieves the desirable high system density within a data center as discussed above.

It should be understood that various changes and modifications to the embodiments described herein will be apparent to those skilled in the art. Such changes and modifications can be made without departing from the spirit and scope of the present disclosure and without diminishing its intended advantages. It is therefore anticipated that all such changes and modifications be covered by the instant application.

What is claimed is:

1. A smart mission critical rack system for a data center, comprising:
    a pre-fabricated cabinet, said cabinet including front-mounted ports for the connection of data transmission lines, power lines and a coolant source adjacent the top thereof, and at least one front-opening door, said cabinet also has sealed side and rear surfaces such that no access to the cabinet is provided on the sides or rear wherein the cabinet is installable against other cabinets or structures in order to achieve a high system density within a data center, said cabinet further including a movable rack substructure therein having a cuboid shape, said movable rack being movable relative to the cabinet and also pivotable about one side or the other in both clock-wise and counter-clockwise directions, and slidable in parallel with the front of the cabinet, when moved out of the cabinet, to permit concurrent access, via only the front-opening door, to the sides or back of all components mounted thereon;
    a power supply subsystem suitable for providing power to electrical components within rack system;
    a fire suppression system suitable for suppressing fire within the cabinet;
    an optional cooling system, said cooling system receiving a source of coolant and maintaining temperature within the rack system at or below a predetermined temperature for protection and efficient operation of the electrical components; and
    a controller, operatively connected to the power subsystem, the cooling system, and a plurality of sensors within said cabinet, wherein said controller operatively monitors and controls the delivery of power to and cooling of the electrical components within the cabinet.

2. The rack system according to claim 1, further comprising at least one cable management component for pivoting or flexing in a generally horizontal plane that supports at least power and data cables connecting to the rack substructure, thereby avoiding unplugging or disconnecting power or data when the rack substructure is moved relative to the cabinet.

3. The rack system according to claim 1, wherein the power supply subsystem includes at least one battery and is suitable for receiving AC power and providing DC power to both electrical components within rack system and to charge the battery.

4. The rack system according to claim 1, further including, within the cabinet, a hot or cold aisle for ductless circulation of air by the cooling system.

5. A mission critical rack system for a data center, comprising:
   a pre-fabricated cabinet, including
      at least one front-opening door,
      sealed side, top and rear surfaces such that with said at least one front-opening door in a closed position the cabinet is self-contained, and no access to the cabinet is provided on the sides or rear such that other cabinets and structures may be installed against both the sides and rear of the cabinet to achieve a high system density within a data center,
   said cabinet further including a movable rack substructure therein and a plate in a top section of said cabinet, said plate sliding outward on at least one slide when the at least one front-opening door is in an open position; said sliding plate providing support to at least one data cable resting thereon, and said plate further providing an operatively-linked guide for the movable rack substructure, wherein the rack substructure is movable relative to the cabinet.

6. The rack system according to claim 5, wherein said rack substructure is pivotable relative to the cabinet once moved forward.

7. The rack system according to claim 5, wherein said rack substructure is also movable in a direction parallel with the front of the cabinet.

8. The rack system according to claim 5, wherein said rack substructure can be moved entirely out of the cabinet to permit concurrent access, via only the front-opening door, to the back of all components mounted on the rack substructure.

9. The rack system according to claim 5, wherein said cabinet further includes front-mounted ports for the connection of at least one of the group consisting of: data transmission lines, power lines, and coolant hoses.

10. The rack system according to claim 5, wherein said cabinet further includes a section for locating a power supply subsystem, said subsystem including at least one battery and being suitable for receiving AC power and providing DC power to electrical components within rack system.

11. The rack system according to claim 5, wherein said cabinet further includes a section for locating a fire suppression system therein.

12. The rack system according to claim 11, wherein said fire suppression system is suitable for containing and suppressing fire within the enclosed cabinet.

13. The rack system according to claim 5, wherein said cabinet further includes a section for locating a cooling system, said cooling system receiving a source of coolant in order to maintain temperatures within the cabinet at or below a predetermined temperature.

14. The rack system according to claim 13, wherein said cabinet further includes a controller, connected to a plurality of sensors within said cabinet, wherein said controller operatively monitors and controls the delivery of power to and cooling of the electrical components within the cabinet.

* * * * *